(12) United States Patent
Nishi

(10) Patent No.: US 7,408,579 B2
(45) Date of Patent: Aug. 5, 2008

(54) SOLID-STATE IMAGING DEVICE

(75) Inventor: Naoki Nishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 871 days.

(21) Appl. No.: 10/342,982

(22) Filed: Jan. 15, 2003

(65) Prior Publication Data
US 2003/0169351 A1 Sep. 11, 2003

(30) Foreign Application Priority Data
Jan. 18, 2002 (JP) ............................. 2002-009574

(51) Int. Cl.
H04N 3/14 (2006.01)
H04N 9/64 (2006.01)

(52) U.S. Cl. ...................... 348/311; 348/245

(58) Field of Classification Search ................ 348/311, 348/312, 322, 324
See application file for complete search history.

(56) References Cited

U.S. PATENT DOCUMENTS

| 4,689,687 | A | * | 8/1987 | Koike et al. | ............. | 348/322 |
|---|---|---|---|---|---|---|
| 4,723,168 | A | * | 2/1988 | Theuwissen | ............. | 348/311 |
| 5,194,751 | A | * | 3/1993 | Yonemoto et al. | ............. | 257/229 |
| 5,410,349 | A | * | 4/1995 | Tanigawa et al. | ............. | 348/311 |
| 5,530,475 | A | * | 6/1996 | Kannegundla et al. | ...... | 348/322 |
| 5,591,660 | A | * | 1/1997 | Fujikawa et al. | ............. | 438/60 |
| 5,896,172 | A | * | 4/1999 | Korthout et al. | ............. | 348/248 |
| 5,937,025 | A | * | 8/1999 | Smith | ............. | 377/63 |
| 6,040,859 | A | * | 3/2000 | Takahashi | ............. | 348/243 |
| 6,097,433 | A | * | 8/2000 | Kawai et al. | ............. | 348/315 |
| 6,686,962 | B1 | * | 2/2004 | Miyahara | ............. | 348/311 |
| 6,961,088 | B2 | * | 11/2005 | Kameshima et al. | ....... | 348/303 |
| 6,970,193 | B1 | * | 11/2005 | Kidono et al. | ............. | 348/245 |
| 7,046,283 | B1 | * | 5/2006 | Kamasz et al. | ............. | 348/295 |
| 2001/0043275 | A1 | * | 11/2001 | Hirota et al. | ............. | 348/312 |
| 2002/0024066 | A1 | * | 2/2002 | Ide | ............. | 257/214 |

* cited by examiner

Primary Examiner—Lin Ye
Assistant Examiner—Dillon Durnford-Geszvain
(74) Attorney, Agent, or Firm—Robert J. Depke; Rockey, Depke & Lyons, LLC

(57) ABSTRACT

In a solid-state imaging device, bus lines are provided at both sides of an imaging area vertically to send vertical-transfer clock pulses to shunt wires disposed on or over the imaging area at both ends of the signal lines of the shunt wires. Bus lines disposed closer to a horizontal transfer register are placed at a boundary area of the imaging area and the horizontal transfer register. Since the bus lines pass through an upper layer of the boundary area, imaging performed by light receiving elements is not performed but dummy pixels having almost the same structure as the light receiving sections are disposed and vertical transfer registers are provided in the boundary area to just transfer signal charges by the vertical transfer registers with a characteristic similar to that in the imaging area to the horizontal transfer register.

22 Claims, 8 Drawing Sheets

SOLID-STATE IMAGING DEVICE

This application claims priority to Japanese Patent Application Number JP2002-009574 filed Jan. 18, 2002, which is incorporated herein by reference.

BACKGROUND OF THE INVENTION

1. Field of the Invention

The present invention relates to solid-state imaging devices having a plurality of light receiving elements arranged two dimensionally in an imaging area, a vertical transfer register and a horizontal transfer register for transferring signal charges of the plurality of light receiving elements, and a shunt wire for sending clock pulses to a transfer electrode of the vertical transfer register, and more particularly, to solid-state imaging devices having a large imaging area.

2. Description of the Related Art

Interline-transfer solid-state imaging devices have been conventionally provided as various image sensors and for digital cameras.

FIG. 1 is an outlined view of a general interline-transfer solid-state imaging device. In the solid-state imaging device, light receiving elements 20 are disposed in an imaging area 10 almost in a two-dimensional matrix manner in a vertical direction (row) and a horizontal direction (column). These light receiving elements 20 convert light incident on a light receiving surface to signal charges having the amount of charges corresponding to the amount of the light, and accumulate them.

A vertical transfer register 30 is disposed at each vertical column of the light receiving elements 20, and a horizontal transfer register 40 is disposed next to the ends of the vertical transfer registers 30 in their transfer direction. An output section 50 is formed next to the end of the horizontal transfer register 40 in its transfer direction.

The solid-state imaging device has a dummy pixel area 60 having a structure similar to that of the light receiving elements 20 but not accumulating signal charges, close to the horizontal transfer register 40 in the imaging area 10. The dummy pixel area 60 is used, for example, for detecting a dark current to set a black level. The position of the dummy pixel area 60 is not limited to the position shown in FIG. 1. The dummy pixel area 60 can be formed at any position close to an end of a light receiving area.

In such solid-state imaging devices, especially in solid-state imaging devices used for video units having large screens, further especially in solid-state imaging devices used for HDTV, for which a high output rate is required, since it is necessary to drive vertical transfer registers at a high speed, shunt wires are generally provided as means for sending a clock signal to the vertical transfer registers.

FIG. 2 is a plan showing an outlined structure of a conventional solid-state imaging device having shunt wires. FIG. 3 is a partial enlarged plan showing a wire structure in an imaging area of the solid-state imaging device shown in FIG. 2.

As shown in FIG. 2, in the solid-state imaging device, light receiving elements (not shown) and vertical transfer registers (not shown) are provided inside an imaging area 10, and a horizontal transfer register 21 and an output section 22 are provided outside the imaging area 10.

Shunt wires 30 are provided in a vertical direction along the vertical transfer registers in an upper layer of the imaging area 10.

Signal lines 31, 32, 33, and 34 of the shunt wires 30 are connected to bus wires 40 disposed in an area outside the imaging area 10 and opposite the horizontal transfer register 21.

Signal lines (bus lines) 41, 42, 43, and 44 of the bus wires 40 are formed in concentric closed-loop manners, and independently connected to electrode pads 51, 52, 53, and 54 to be connected to external wires of the imaging device chip, respectively, with parts of the closed loops being externally extended.

As shown in FIG. 3, the signal lines 31, 32, 33, and 34 of the shunt wires 30 are connected to transfer electrodes (poly-Si electrodes) 64, 63, 62, and 61 of the vertical transfer registers, respectively, through contact sections 35.

In the present case, four-phase clock driving is performed. The signal lines 31, 32, 33, and 34 of the shunt wires 30, the signal lines 41, 42, 43, and 44 of the bus wires 40, the electrode pads 51, 52, 53, and 54, and the transfer electrodes 64, 63, 62, and 61 correspond to each other, respectively, and four sets of four types of components are provided.

In the conventional wire structures such as that described above, however, if the solid-state imaging device has a large chip size, or the frequency of its clock signal is too high, since a propagation delay occurs in the shunt wires 30, the clock signal does not have a satisfactory waveform at the end opposite the end where the bus wires 40 are located, its effective amplitude becomes low, and the amount of charges handled by the vertical transfer registers is reduced.

In a large-sized solid-state imaging devices, since the above problems become more prominent, high-speed driving becomes impossible and a larger number of pixels are unlikely to be provided. The number of frames per unit period cannot be increased, and larger-sized solid-state imaging devices are unlikely to be provided.

SUMMARY OF THE INVENTION

Accordingly, an object of the present invention is to provide a wire structure of solid-state imaging devices, which allows a clock signal to be effectively sent without generating a propagation delay in shunt wires and which allows the solid-state imaging devices to be made larger, to have a larger number of pixels, and to be driven at a higher speed.

The foregoing object is achieved in one aspect of the present invention through the provision of an imaging device including a plurality of light receiving elements disposed within an imaging area, and bus lines which supply electric pulses into the imaging area in at least two directions.

The foregoing object is achieved in another aspect of the present invention through the provision of an imaging device including a plurality of light receiving elements disposed within an imaging area, a plurality of vertical transfer registers which read out charges from said plurality of light receiving elements and transfer read-out charges in a vertical direction, a horizontal transfer register which transfers the read-out charges transferred from said plurality of vertical transfer registers in a horizontal direction, shunt wires which are disposed along said plurality of vertical transfer registers and supply driving pulses to vertical transfer electrodes of said plurality of vertical transfer registers; and bus lines which supply driving pulses to said shunt wires from both vertical sides of said shunt wires.

In solid-state imaging devices according to the present invention, clock pulses are sent to shunt wires disposed vertically from bus lines disposed at both sides of the shunt wires vertically, and the clock pulses are input at both ends of the shunt wires. Therefore, in many cases, the deterioration of the waveform of the clock pulses, caused by a propagation delay at an end of the shunt wires does not occur, and a sufficient effective amplitude is obtained.

DESCRIPTION OF THE PREFERRED EMBODIMENTS

Figure 1:
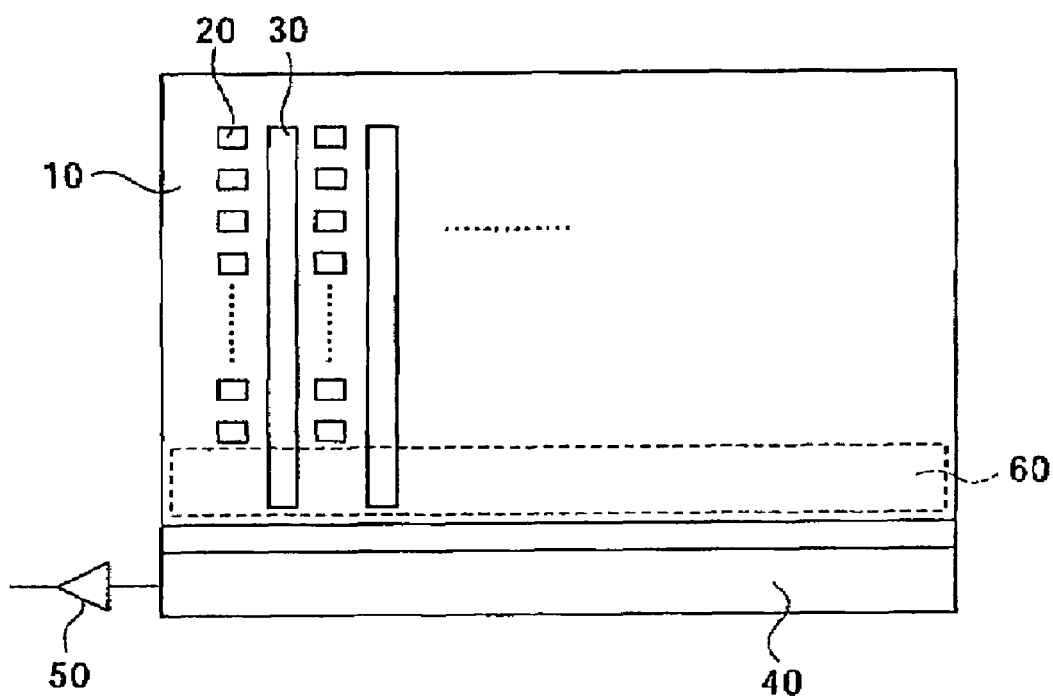
FIG. 1 is a plan showing an outlined structure of a general interline-transfer solid-state imaging device.
Figure 2:
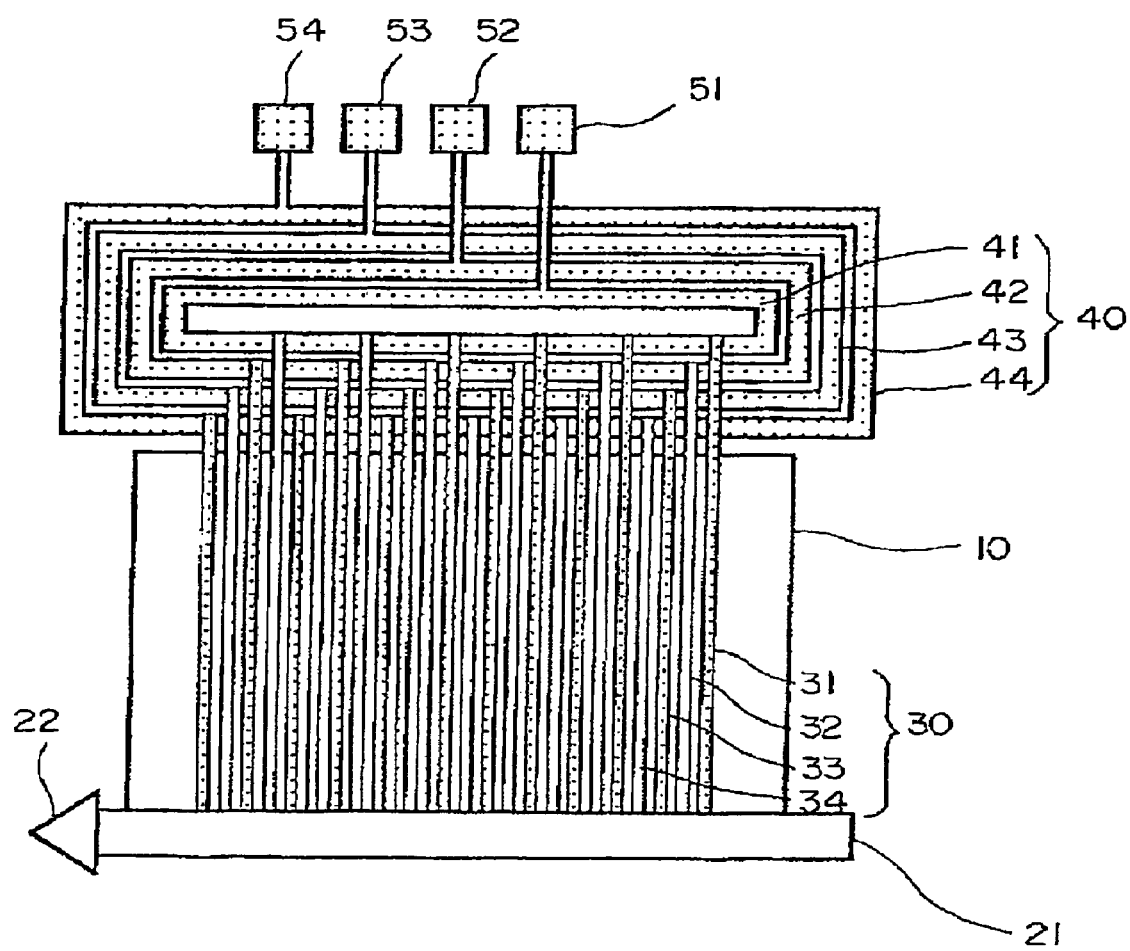
FIG. 2 is a plan showing an outlined structure of a conventional solid-state imaging device.

Embodiments of the present invention will be described below in detail by referring to the drawings.

The embodiments described below are preferred embodiments of the present invention and have various preferred technical restrictions. The present invention is not limited to the embodiments described below unless the present invention is limited in the following description. The present invention can be applied, for example, to imaging devices, such as CCD solid-state imaging devices and CMOS sensors.

In solid-state imaging devices according to the embodiments described below, clock pulses are input to shunt wires at both ends of the shunt wires so as to eliminate the deterioration of an effective amplitude obtained at an end of the shunt wires, caused by a propagation delay.

It is conventionally difficult to place bus wires at a side of an imaging area, where a horizontal transfer register is provided, because there is the horizontal transfer register. With a structure described in the following descriptions, however, it becomes possible to place bus wires at a boundary area of an imaging area and a horizontal transfer register, and clock pulses are allowed to be input from both sides of shunt wires.

In the embodiments described below, "vertically (a vertical direction)" means a direction almost the same as the transfer direction of vertical transfer registers, and "horizontally (a horizontal direction)" indicates a direction almost perpendicular to the "vertical direction."

In the embodiments described below, the structure of an imaging area is the same as that shown in FIG. 1.

Figure 3:
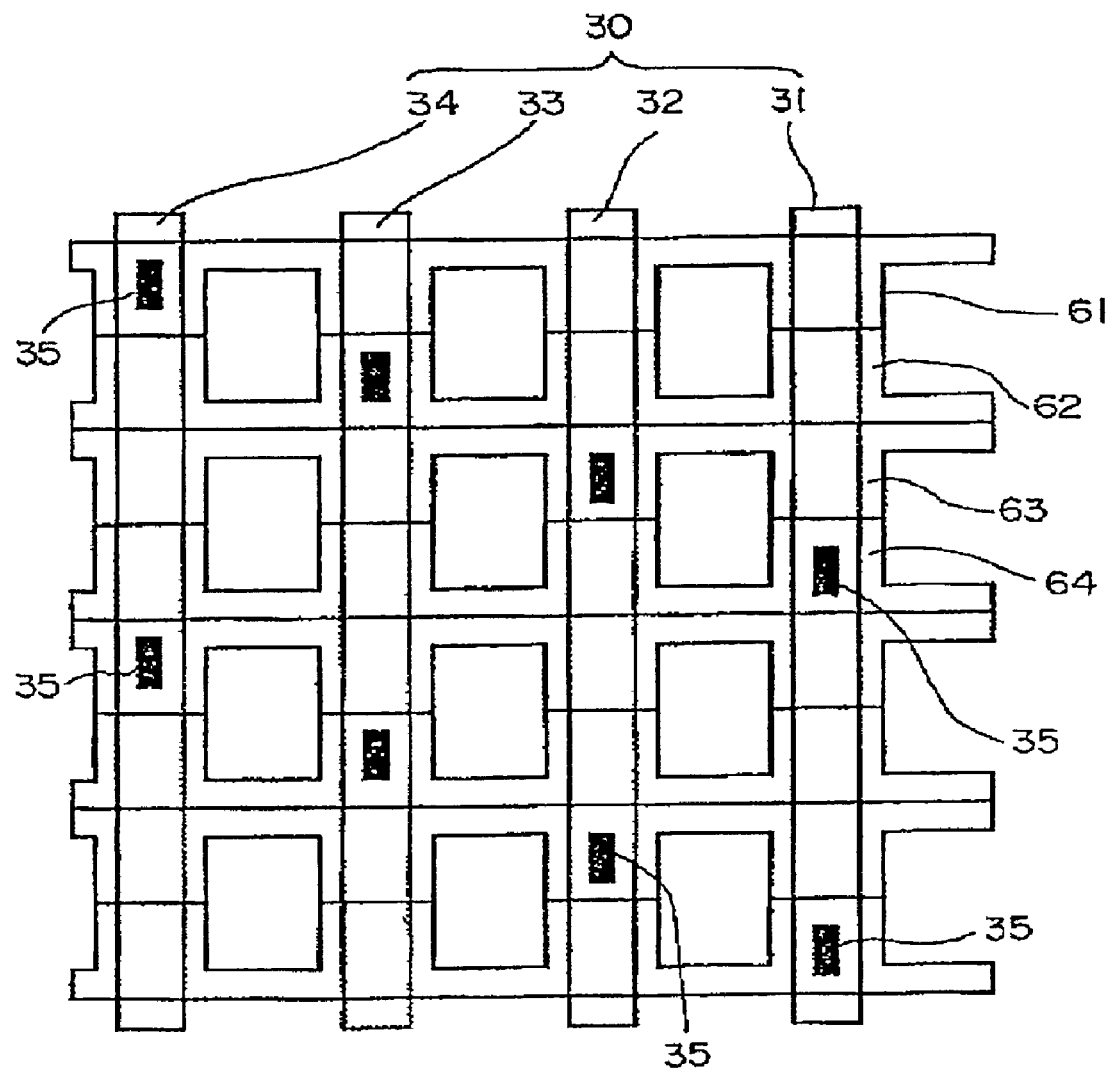
FIG. 3 is a partial enlarged plan showing a wiring structure in an imaging area of the solid-state imaging device shown in FIG. 2.
Figure 4:
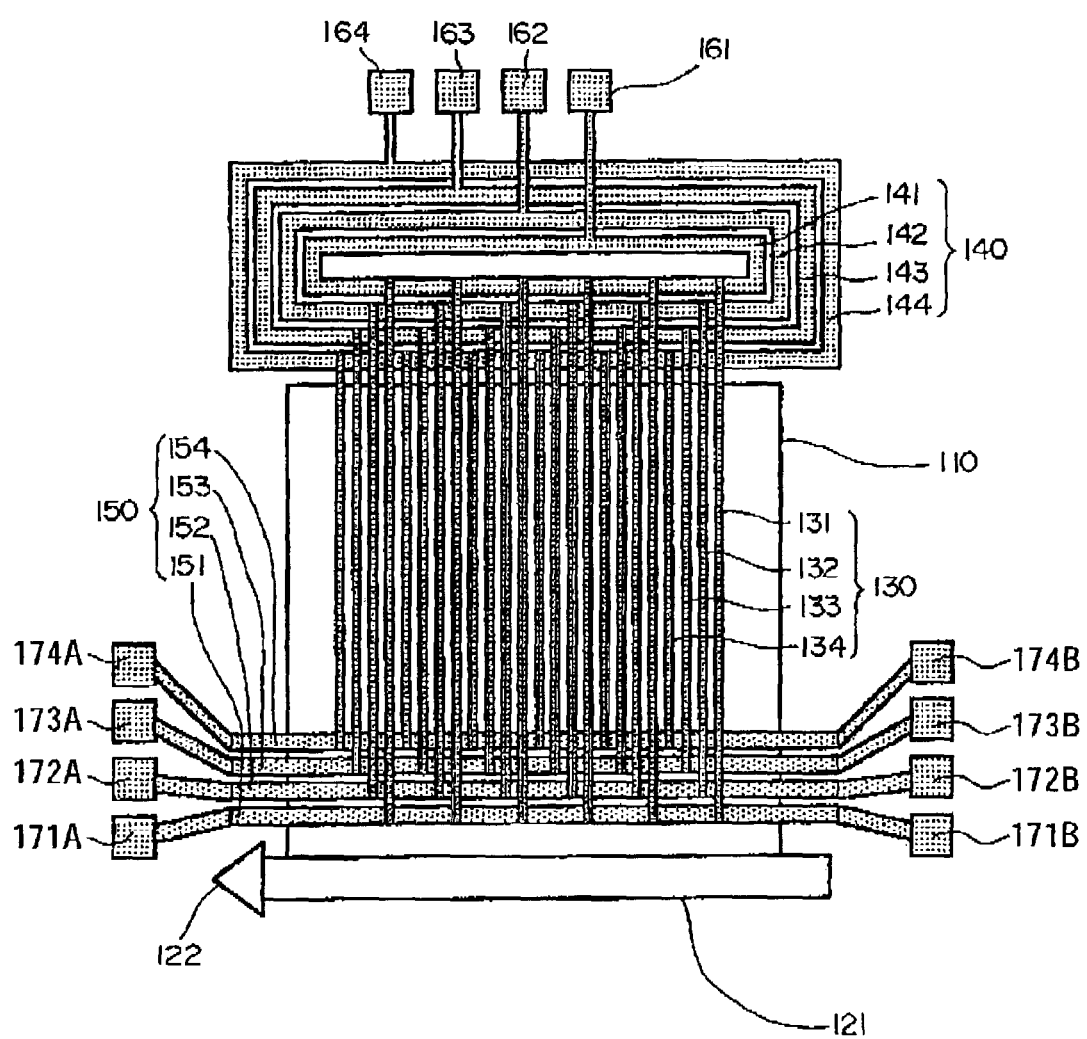
FIG. 4 is a plan showing an outlined structure of a solid-state imaging device according to a first embodiment of the present invention.

FIG. 4 is a plan showing an outlined structure of a solid-state imaging device according to a first embodiment of the present invention. A connection structure between shunt wires and vertical transfer registers is the same, for example, as the conventional case shown in FIG. 3. Therefore, a description thereof is omitted.

As shown in FIG. 4, in the solid-state imaging device, bus wires 140 and 150 are provided at both sides of an imaging area 110 vertically to send vertical-transfer clock pulses to shunt wires 130 disposed on or over the imaging area 110, at both ends of signal lines 131, 132, 133, and 134 of the shunt wires 130. The shunt wires 130 and the bus wires 140 and 150 are made from a low-resistance electrode material, such as a metal.

Light receiving elements and vertical transfer registers are provided in the imaging area 110 although they are not shown. The signal lines of the shunt wires 130 are vertically disposed along the vertical transfer registers.

A horizontal transfer register 121 and an output section 122 are disposed at a vertical side of the imaging area 110. The horizontal transfer register 121 transfers signal charges transferred by the vertical transfer registers, horizontally for each horizontal line, and the output section 122 converts them to an imaging signal and outputs it.

Among the bus wires 140 and 150, the bus wires 140 disposed opposite the horizontal transfer register 121 are placed at the outside of the imaging area 110. Four signal lines (bus lines) 141, 142, 143, and 144 of the bus wires 140 are formed in concentric, rectangular closed-loop manners, and are selectively connected to the signal lines 131, 132, 133, and 134 of the shunt wires 130.

The signal lines 141, 142, 143, and 144 are independently connected to electrode pads 161, 162, 163, and 164 to be connected to external wires of the imaging device chip, respectively, with parts of the closed loops being externally extended.

Since the signal lines 141, 142, 143, and 144 are formed in the closed-loop manners, and the closed loops are connected to the electrode pads 161, 162, 163, and 164, clock pulses are sent to the whole of the bus lines as efficient as possible in the bus wires 140 while the number of electrode pads is suppressed.

Among the bus wires 140 and 150, the bus wires 150 disposed closer to the horizontal transfer register 121 are placed at a boundary area of the imaging area 110 and the horizontal transfer register 121. Four signal lines (bus lines) 151, 152, 153, and 154 of the bus wires 150 are horizontally disposed in parallel, and are selectively connected to the signal lines 131, 132, 133, and 134 of the shunt wires 130.

The signal lines 151, 152, 153, and 154 are independently connected at their both ends to electrode pads 171A, 172A, 173A, and 174A, and 171B, 172B, 173B, and 174B to be connected to external wires of the imaging device chip, respectively.

Since the signal lines 151, 152, 153, and 154 are connected at their both ends to the electrode pads 171A, 172A, 173A, and 174A, and 171B, 172B, 173B, and 174B in this way, more highly precise clock pulses can be sent to both ends of the bus lines in the bus lines 150 although the number of electrode pads is increased.

The boundary area of the imaging area 110 and the horizontal transfer register 121, where the bus wires 150 are disposed, is an extended area of the imaging area 110. Dummy pixels having almost the same structure as the light receiving elements for actual imaging in the imaging area 110 are disposed, and the vertical transfer registers are also disposed in the boundary area.

In other words, in this area (the area where the four horizontal lines are disposed in this case), since the bus wires 150 pass through an upper layer of the area, imaging performed by light receiving elements is not performed but signal charges are transferred by the vertical transfer registers with a characteristic similar to that in the imaging area 110 to pass the charges to the horizontal transfer register 121. The dummy pixels can be easily manufactured in a process similar to that for the usual light receiving elements with light-receiving openings being not provided for shielding films in the upper layer.

With such a structure, in the present embodiment, the bus wires 140 and 150 are disposed at both sides of the imaging area to allow the clock pulses to be applied at both ends of the shunt wires 130. Therefore, clock pulses having an appropriate waveform and a sufficiently effective amplitude can be applied to transfer electrodes of the vertical transfer registers in the entire imaging area.

As described above, four-phase clock driving is used in the present embodiment. The signal lines 131, 132, 133, and 134 of the shunt wires 130, the signal lines 141, 142, 143, and 144, and 151, 152, 153, and 154 of the bus wires 140 and 150, the electrode pads 161, 162, 163, and 164, and 171, 172, 173, and 174 correspond to each other, respectively, and four sets of five types of components are provided.

Figure 5:
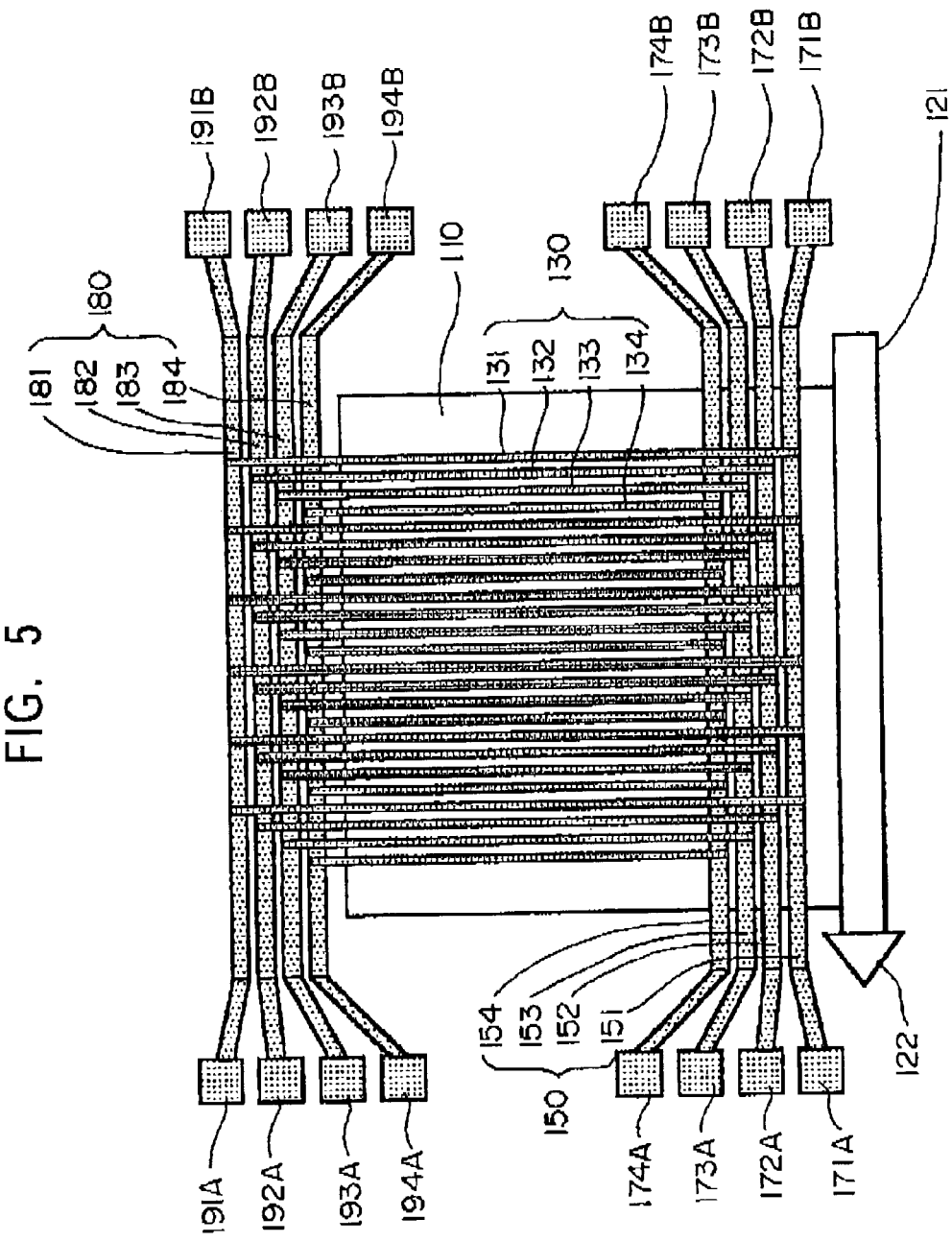
FIG. 5 is a plan showing an outlined structure of a solid-state imaging device according to a second embodiment of the present invention.

FIG. 5 is a plan showing an outlined structure of a solid-state imaging device according to a second embodiment of the present invention. In FIG. 5, the same symbols as those used in FIG. 4 are applied to the same portions as those shown in FIG. 4.

In the solid-stage imaging device, bus wires 180 similar to the bus wires 150, having signal lines (bus lines) 181, 182, 183, and 184, are disposed in parallel as bus lines disposed opposite a horizontal transfer register 121, instead of the closed-loop bus wires 140 shown in FIG. 4.

More specifically, in the bus wires 180, the straight-line-shaped signal lines 181, 182, 183, and 184 are provided outside an imaging area 110. The signal lines 181, 182, 183, and 184 are selectively connected to signal lines 131, 132, 133, and 134 of shunt wires 130. The signal lines 181, 182, 183, and 184 are connected at their both ends to electrode pads 191A, 192A, 193A, and 194A, and 191B, 192B, 193B, and 194B, respectively.

Since the other structures are the same as in the embodiment shown in FIG. 4, a description thereof is omitted.

Figure 6:
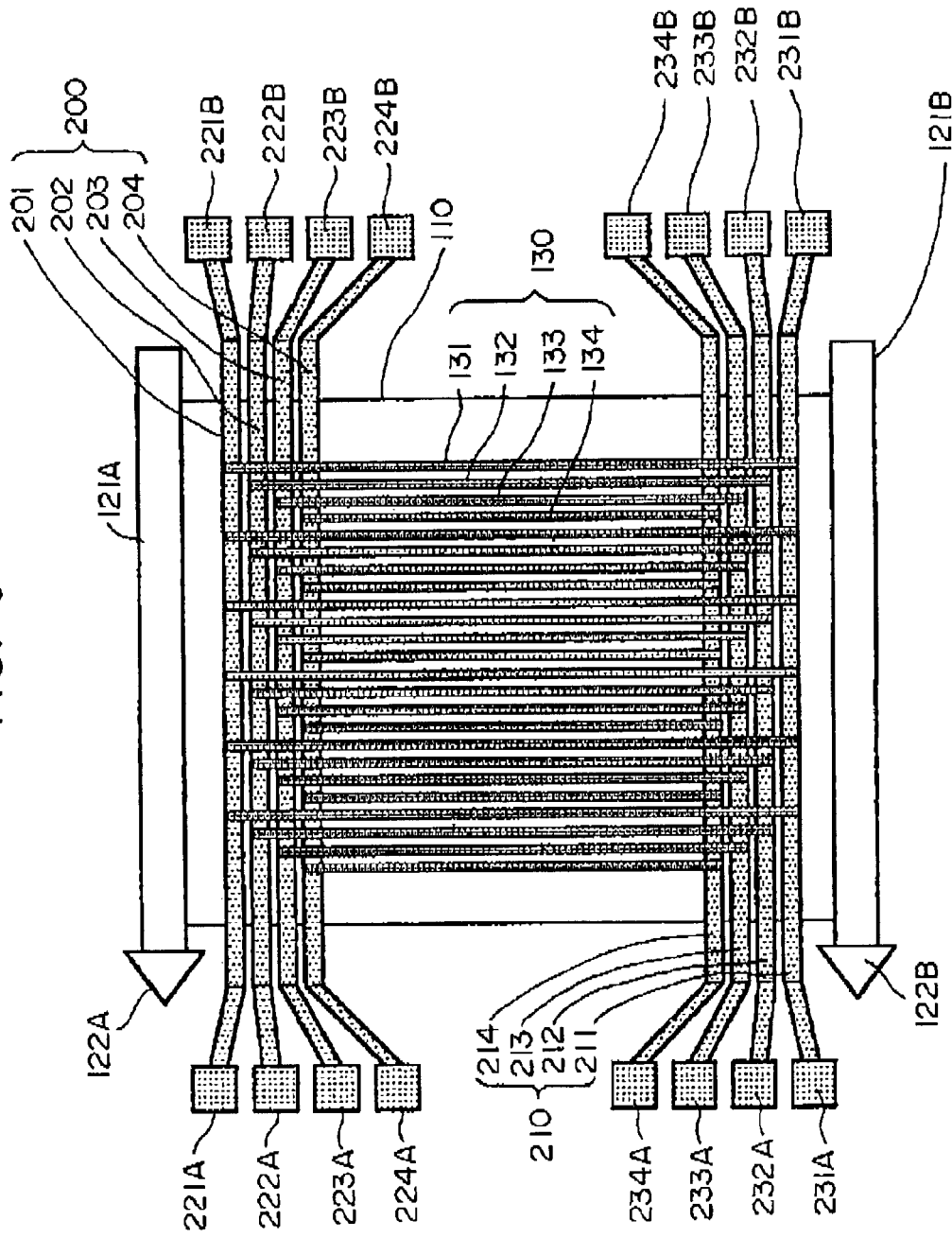
FIG. 6 is a plan showing an outlined structure of a solid-state imaging device according to a third embodiment of the present invention.

FIG. 6 is a plan showing an outlined structure of a solid-state imaging device according to a third embodiment of the present invention. In FIG. 6, the same symbols as those used in FIG. 4 are applied to the same portions as those shown in FIG. 4.

In the solid-state imaging device, horizontal transfer registers 121A and 121B are provided at both sides of an imaging area 110. For example, light receiving elements at odd-numbered columns transfer charges to the horizontal transfer register 121A, and light receiving elements at even-numbered columns transfer charges to the horizontal transfer register 121B.

In the present embodiment, the horizontal transfer registers 121A and 121B are provided at both sides of the imaging area 110, as described above, and in additions bus wires 200 and 210 having the same structure as the bus wires 150, described above in FIG. 4, are disposed at the both sides of the imaging area 110.

More specifically, the bus wires 200 are disposed at a boundary area of the imaging area 110 and the horizontal transfer register 121A. Four signal lines (bus lines) 201, 202, 203, and 204 of the bus wires 200 are horizontally disposed in parallel, and are selectively connected to signal lines 131, 132, 133, and 134 of shunt wires 130.

The signal lines 201, 202, 203, and 204 are independently connected at both ends to electrode pads 221A, 222A, 223A, and 224A, and 221B, 222B, 223B, and 224B to be connected to external wires of the imaging device chip, respectively.

In contrast, the bus wires 210 are disposed at a boundary area of the imaging area 110 and the horizontal transfer register 121B. Four signal lines (bus lines) 211, 212, 213, and 214 of the bus wires 210 are horizontally disposed in parallel, and are selectively connected to the signal lines 131, 132, 133, and 134 of the shunt wires 130.

The signal lines 211, 212, 213, and 214 are independently connected at both ends to electrode pads 231A, 232A, 233A, and 234A, and 231B, 232B, 233B, and 234B to be connected to external wires of the imaging device chip, respectively.

At the boundary areas between the imaging area 110 and the horizontal transfer registers 121A and 121B, where the bus wires 200 and 210 are provided, dummy pixels are formed and vertical transfer registers are disposed in the same way as in the embodiment described by referring to FIG. 4.

Figure 7:
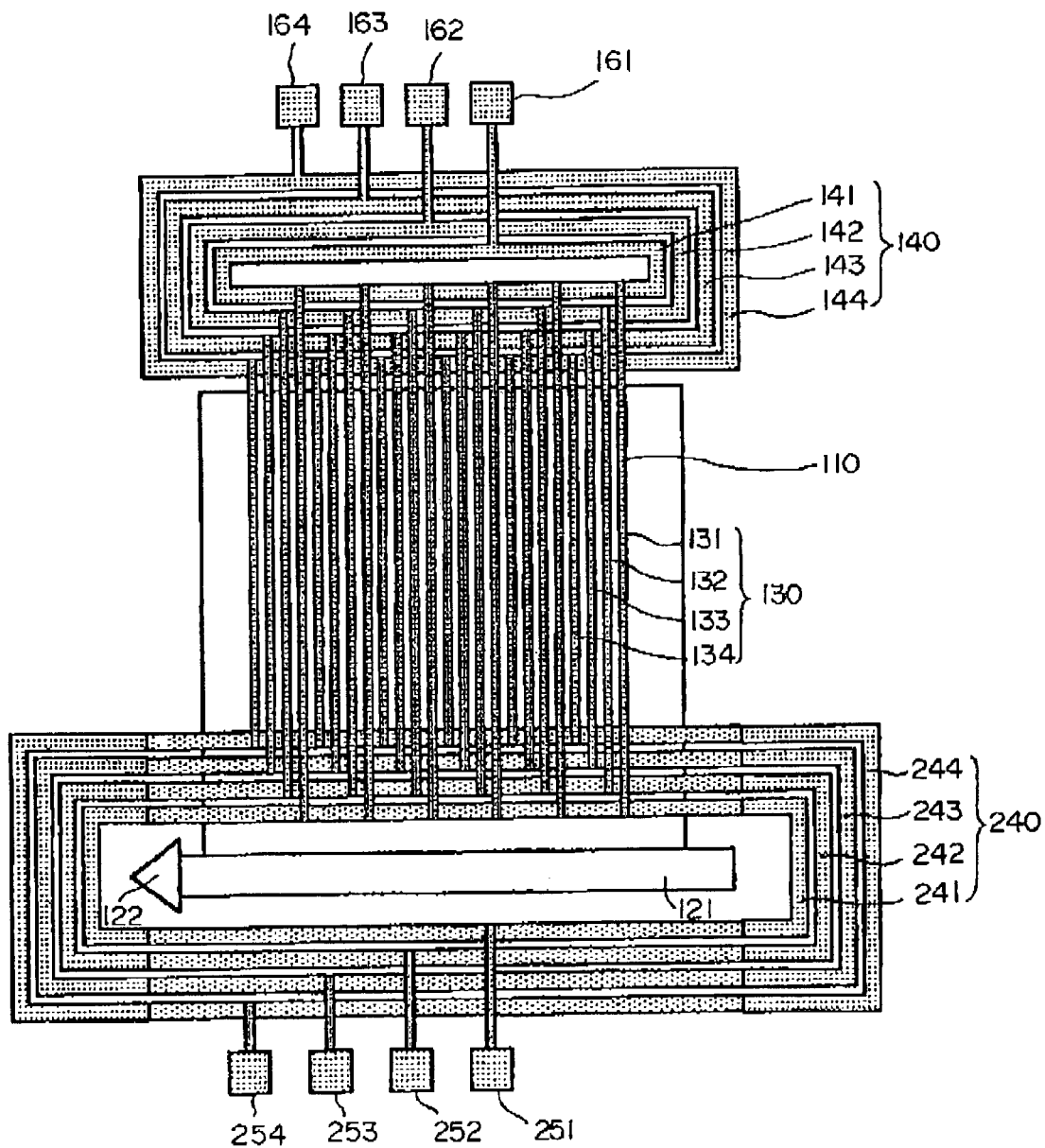
FIG. 7 is a plan showing an outlined structure of a solid-state imaging device according to a fourth embodiment of the present invention.

FIG. 7 is a plan showing an outlined structure of a solid-state imaging device according to a fourth embodiment of the present invention. In FIG. 7, the same symbols as those used in FIG. 4 are applied to the same portions as those shown in FIG. 4.

In the solid-state imaging device, closed-loop-shaped bus wires 240 are used as bus wires closer to a horizontal transfer register 121.

More specifically, four signal lines (bus lines) 241, 242, 243, and 244 of the bus wires 240 are formed in concentric, rectangular closed-loop manners so as to enclose the periphery of the horizontal transfer register 121. An inner part of the bus wires is disposed at a boundary area of an imaging area 110 and the horizontal transfer register 121, and an outer part thereof is disposed at an outer side of the horizontal transfer register 121. The signal lines 141, 142, 143, and 144 are independently connected to electrode pads 251, 252, 253, and 254 to be connected to external wires of the imaging device chip, respectively, with parts of the closed loops being externally extended.

At the boundary area between the imaging area 110 and the horizontal transfer register 121, dummy pixels are formed and vertical transfer registers are disposed in the same way as in the embodiment described by referring to FIG. 4.

With such a structure, the number of electrode pads connected to the bus wires 240 disposed closer to the horizontal transfer register 121 is reduced.

Bus wires 140 disposed opposite the horizontal transfer register 121 are the same as those in the embodiment shown in FIG. 4, a description thereof is omitted.

Figure 8:
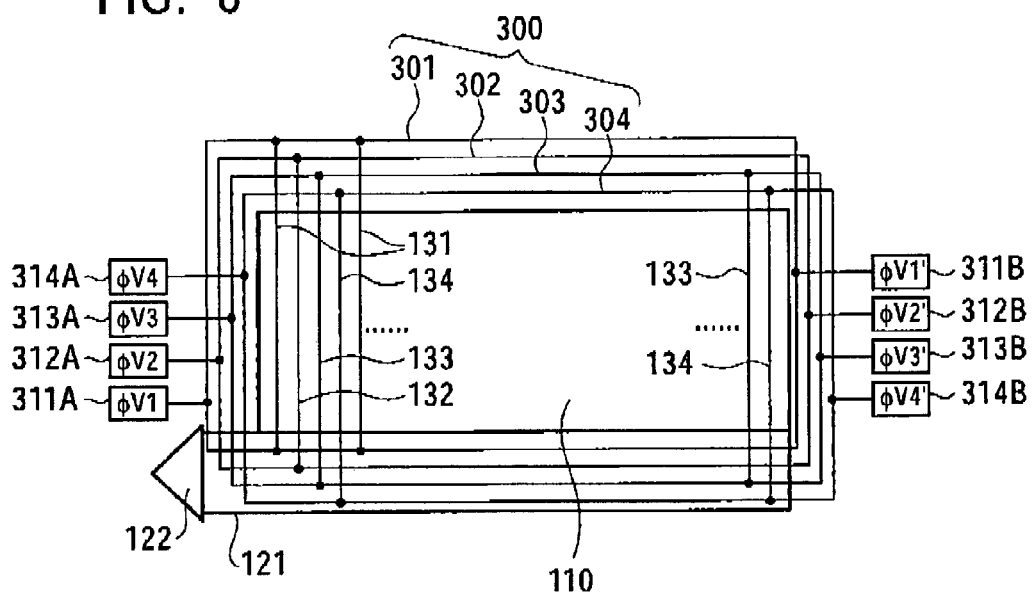
FIG. 8 is a plan showing an outlined structure of a solid-state imaging device according to a fifth embodiment of the present invention.

FIG. 8 is a plan showing an outlined structure of a solid-state imaging device according to a fifth embodiment of the present invention. In FIG. 8, the same symbols as those used in FIG. 4 are applied to the same portions as those shown in FIG. 4.

In the solid-state imaging device, loop-shaped portions of bus wires 300 are formed so as to enclose an imaging area 110. A part of the loop-shaped portions of the bus wires 300 is disposed on or over a horizontal transfer register 121. The loop-shaped portions of signal lines 301, 302, 303, and 304 of the bus wires 300 are formed so as to have almost the same length.

Signal lines 131, 132, 133, and 134 of shunt wires 130 are disposed inside the loop-shaped portions of the signal lines 301, 302, 303, and 304 of the bus wires 300. The signal lines 131, 132, 133, and 134 of the shunt wires are connected at both ends to the signal lines 301, 302, 303, and 304 of the bus lines.

In the present embodiment, parts of each loop in the bus lines 300 are externally extended to connect to two electrode pads to be connected to external wires.

With such a structure, since clock pulses are sent to both ends of each signal line of the shunt wires 130 through the corresponding loop of the bus lines 300, the number of electrode pads is reduced compared with the first to third embodiments described above. Since each loop of the bus lines 300 has almost the same length, when leads to the electrode pads, of each loop also have almost the same length, clock pulses are more uniformly sent to the shunt wires. Since the shunt wires 130 have almost the same length in the present embodiment, clock pulses are also sent to transfer electrodes of vertical transfer registers almost uniformly.

Figure 9:
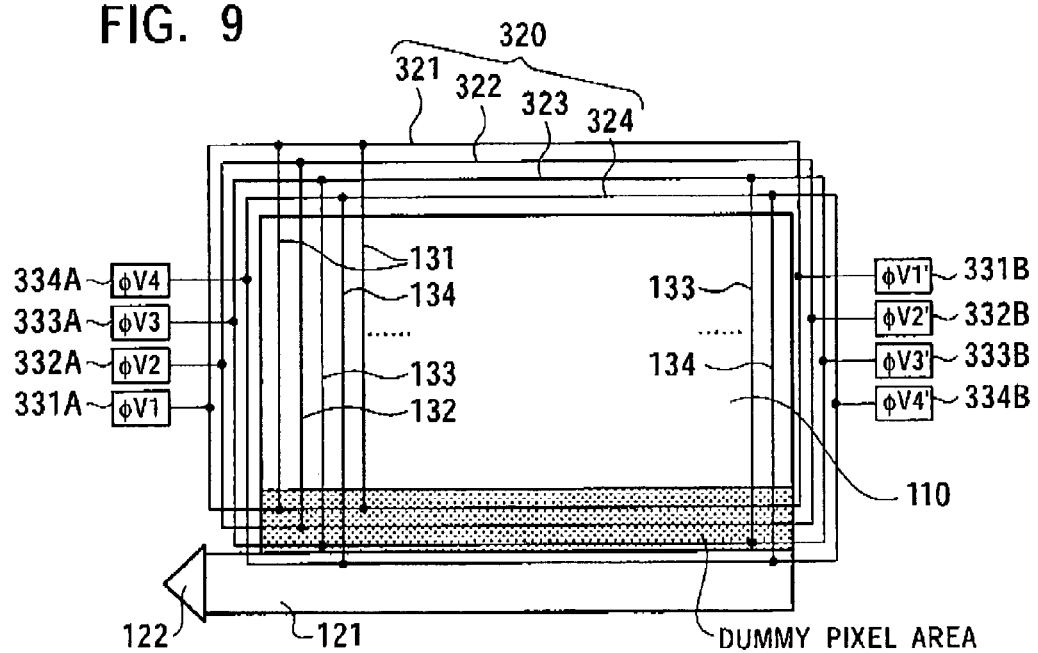
FIG. 9 is a plan showing an outlined structure of a solid-state imaging device according to a sixth embodiment of the present invention.

FIG. 9 is a plan showing an outlined structure of a solid-state imaging device according to a sixth embodiment of the present invention. In FIG. 9, the same symbols as those used in FIG. 4 are applied to the same portions as those shown in FIG. 4.

In the solid-state imaging device, loop-shaped portions of bus wires 320 are formed so as to enclose a plurality of light receiving elements in an imaging area 110. A part of the loop-shaped portions of the bus wires 320 is disposed on or over a dummy-pixel area in the imaging area 110. The loop-shaped portions of signal lines 321, 322, 323, and 324 of the bus wires 320 are formed so as to have almost the same length.

Signal lines 131, 132, 133, and 134 of shunt wires 130 are disposed inside the loop-shaped portions of the signal lines 321, 322, 323, and 324. The signal lines 131, 132, 133, and 134 of the shunt wires are connected at both ends to the signal lines 321, 322, 323, and 324 of the bus wires.

In the present embodiment, parts of each loop in the bus wires 320 are externally extended to connect to two electrode pads to be connected to external wires.

With such a structure, since clock pulses are sent to both ends of each signal line of the shunt wires 130 through the corresponding loop of the bus wires 320, the number of electrode pads is reduced compared with the first to third embodiments described above. Since each loop of the bus wires 320 has almost the same length, when leads to the electrode pads, of each loop also have almost the same length, clock pulses are more uniformly sent to the shunt wires. Since the shunt wires 130 have almost the same length in the present embodiment, clock pulses are also sent to transfer electrodes of vertical transfer registers almost uniformly. Since the part of the loop-shaped portions of the bus wires 320 is disposed on or over the dummy-pixel area in the imaging area 110 in the present embodiment, the shunt wires 130 have a shorter length than in the fifth embodiment, described above.

In the solid-state imaging devices according to the above embodiments, since the clock pulses are sent from both sides of the shunt wires, fast clock pulses can be appropriately applied to transfer electrodes to implement a high frame rate.

For example, a solid-state imaging device as large as 35-mm film can be implemented without reducing the frame rate.

A high frame rate has been strongly demanded, for example, in an HDTV 1080/60P standard with BS digital broadcasting being spread, and is required very much for high-speed image capturing.

Solid-state imaging devices having a large area have been required very much because optical systems for film cameras can be used as they are.

The solid-state imaging devices according to the above-described embodiments can effectively satisfy such needs, and great advantages are expected.

Solid-state imaging devices according to the present invention are not limited to those having the structures shown in FIG. 4 to FIG. 9. Various modifications are possible within the scope of the present invention.

For example, a plurality of horizontal transfer registers may be formed at one side or both sides of an imaging area. In the above-described embodiments, four-phase driving is used for the vertical transfer registers. The present invention is not limited to this case. Three-phase driving and others may be used.

In solid-state imaging devices according to the present invention, clock pulses are sent to shunt wires disposed vertically from bus wires disposed at both vertical sides of the shunt wires, and the clock pulses are input at both ends of the shunt wires. Therefore, the deterioration of the waveform of the clock pulses, caused by a propagation delay at an end of the shunt wires is eliminated, and a sufficiently effective amplitude is obtained.

Therefore, even when the solid-state imaging devices are made larger, have a larger number of pixels, or are driven by faster clock pulses, appropriate clock pulses can be sent to the entire vertical transfer registers through the shunt wires, and an appropriate operation can be obtained.

What is claimed is:

1. An imaging device, comprising: a plurality of pixel elements disposed within an imaging area which receive external light;
   a dummy portion formed within the imaging area and adjacent the plurality of pixel elements which receive external light, the dummy portion being comprised of a plurality of pixel elements which are at least partially shielded from the external light;
   and bus lines which supply electrical pulses into the imaging area in at least two directions, wherein at least one of said bus lines is disposed directly over the pixel elements of the dummy portion of the imaging area in a depth direction of the imaging device.

2. An imaging device according to claim 1, wherein the dummy pixels which are at least partially shielded from the external light are formed to detect a dark current in the imaging area.

3. An imaging device comprising:
   a plurality of pixel elements arranged in an array which define an imaging area; bus lines which supply electrical pulses into the imaging area in at least two directions for transferring signal charges within the imaging area; and
   a transfer register which is disposed on a side of the imaging area for transferring charges read out from said plurality of pixel elements, wherein at least one of said bus lines is disposed between said transfer register and the plurality of pixel elements of said imaging area which generate image data, and further wherein a first set of bus lines is located at a first side of the pixel elements and a second set of bus lines is located at a second side of the pixel elements with the array of pixel elements therebetween, and further comprising a plurality of shunt wires extending across the array of pixel elements and connecting individual ones of the first and second set of bus lines; and
   wherein there is a first set of bus line portions which are at least substantially coextensive with an adjacent edge of the imaging array located at a first side of the pixel elements and a second set of bus line portions which are at least substantially coextensive with an adjacent edge of the imaging array located at a second side of the pixel elements with the array of pixel elements therebetween.

4. An imaging device according to claim 3, wherein said at least one bus line disposed between said transfer register and said plurality of light receiving elements extends substantially the entire width of the horizontal overlap between the imaging area and the horizontal transfer register.

5. An imaging device comprising:
a plurality of pixel elements which define an imaging area; and
bus lines which supply electrical pulses into the imaging area in at least two directions, wherein at least one of said bus lines includes a looped portion surrounding the imaging area;
and a transfer register which is disposed on a side of the imaging area for transferring charges read out from one or more of said pixel elements, wherein a part of the looped portion is disposed over said transfer register in a depth direction of the imagine device.

6. An imaging device according to claim 5,
said imaging device further comprising a dummy portion formed within the imaging area and adjacent the plurality of pixel elements which receive external light, the dummy portion being comprised of a plurality of pixel elements which are at least partially shielded from the external light,
wherein said looped portion surrounds said plurality of pixel elements which receive external light,
and at least a part of said looped portion is disposed over the dummy portion of the imaging area in a depth direction of the imaging device.

7. An imaging device according to claim 6, wherein the dummy pixel elements are formed to detect a dark current in the imaging area.

8. An imaging device comprising:
a plurality of pixel elements disposed within an imaging area which receive external light;
a plurality of vertical transfer registers which read out charges from said plurality of light receiving elements and transfer read-out charges in a vertical direction;
a horizontal transfer register which transfers the read-out charges transferred from said plurality of vertical transfer registers in a horizontal direction;
a plurality of shunt wires which are disposed in a parallel direction to the plurality of vertical transfer registers and supply driving pulses to vertical transfer electrodes of said plurality of vertical transfer registers; and
a plurality of bus lines which supply driving pulses to said shunt wires from both vertical sides of said shunt wires, and wherein a first set of bus lines is located at a first side o: the pixel elements and a second set of bus lines is located at a second side of the pixel elements with the array of pixel elements therebetween, and further wherein the plurality of shunt wires extend across the array of pixel elements and connect individual ones of the first and second set of bus lines; and
wherein there is a first set of bus line portions which are at least substantially coextensive with an adjacent edge of the imaging array located at a first side of the pixel elements and a second set of bus line portions which are at least substantially coextensive with an adjacent edge of the imaging array located at a second side of the pixel elements with the array of pixel elements therebetween.

9. An imaging device according to claim 8, wherein said bus lines are disposed along the horizontal direction and selectively connected to said shunt wires.

10. An imaging device according to claim 8, wherein said horizontal transfer register is adjacent to the imaging area, and at least one of said bus lines is disposed between said horizontal transfer register and said plurality of light receiving elements.

11. An imaging device according to claim 8,
further comprising a dummy portion formed within the imaging area and adjacent the plurality of pixel elements which receive external light, the dummy portion being comprised of a plurality of pixel elements which are at least partially shielded from the external light;
wherein at least one of said bus lines is disposed over the dummy portion of the imaging area in a depth direction of the imaging device.

12. An imaging device according to claim 11, wherein the dummy portion includes dummy pixels which are formed to detect a dark current in the imaging area.

13. An imaging device according to claim 8, wherein at least one of said bus lines includes a looped portion.

14. An imaging device according to claim 13, wherein said looped portion surrounds the imaging area.

15. An imaging device according to claim 14, wherein at least a part of said looped portion is disposed over said horizontal transfer register in a depth direction of the imaging device.

16. An imaging device according to claim 13, wherein said looped portion surrounds said plurality of light receiving elements, and at least a part of said looped portion is disposed over a dummy portion of the imaging area in a depth direction of the imaging device.

17. An imaging device according to claim 16, wherein the dummy portion includes dummy pixels which are formed to detect a dark current in the imaging area.

18. An imaging device according to claim 13, wherein each of said shunt wires is disposed within one looped portion of said bus lines, and both ends of each of said shunt wires are connected to one looped portion of said bus lines.

19. An imaging device according to claim 13, wherein each looped portion of said bus lines is connected to at least two electrical pads.

20. An imaging device according to claim 13, wherein the major axis of said looped portion extends in a parallel direction to the horizontal transfer register.

21. An imaging device according to claim 8, wherein a plurality of said bus lines include looped portions having substantially the same length.

22. An imaging device comprising:
a plurality of pixel elements which defing an imaging area which are arranged in a two-dimensional array; and bus lines which supply electrical pulses into the imaging area in at least two directions, wherein at least at least two of said bus lines included a looped portion surrounding the imaging area.

* * * * *